(12) United States Patent
Roitman et al.

(10) Patent No.: US 11,545,597 B2
(45) Date of Patent: Jan. 3, 2023

(54) FABRICATION FOR PRECISE LINE-BOND CONTROL AND GAS DIFFUSION BETWEEN LED COMPONENTS

(71) Applicant: Lumileds LLC, San Jose, CA (US)

(72) Inventors: Daniel Bernardo Roitman, Menlo Park, CA (US); Michael Laughner, San Jose, CA (US)

(73) Assignee: Lumileds LLC, San Jose, CA (US)

( * ) Notice: Subject to any disclaimer, the term of this patent is extended or adjusted under 35 U.S.C. 154(b) by 62 days.

(21) Appl. No.: 16/584,642

(22) Filed: Sep. 26, 2019

(65) Prior Publication Data

US 2020/0105979 A1   Apr. 2, 2020

Related U.S. Application Data

(60) Provisional application No. 62/738,631, filed on Sep. 28, 2018.

(30) Foreign Application Priority Data

Dec. 5, 2018   (EP) ..................... 18210355

(51) Int. Cl.
*H01L 33/50* (2010.01)
*H01L 33/62* (2010.01)
*H01L 33/44* (2010.01)

(52) U.S. Cl.
CPC ............ *H01L 33/502* (2013.01); *H01L 33/44* (2013.01); *H01L 33/505* (2013.01); *H01L 33/62* (2013.01); *H01L 2933/0025* (2013.01)

(58) Field of Classification Search
CPC ....... H01L 33/44; H01L 33/62; H01L 33/505; H01L 33/502; H01L 2933/0025; H01L 2933/0041
See application file for complete search history.

(56) References Cited

U.S. PATENT DOCUMENTS

| 10,128,419 | B1 | 11/2018 | Shimizu et al. | |
| 2007/0217019 | A1* | 9/2007 | Huang | G02B 3/0031 |
| | | | | 359/642 |
| 2008/0197378 | A1* | 8/2008 | Kong | H01L 33/0093 |
| | | | | 257/E33.068 |

(Continued)

FOREIGN PATENT DOCUMENTS

| EP | 1879238 A1 | 1/2008 |
| EP | 2712905 A1 | 4/2014 |

(Continued)

OTHER PUBLICATIONS

Bibliography of EP Publication No. 1897238A1, published on Mar. 12, 2008, corresponding to WO2007/003696A1 dated Jan. 11, 2007.

(Continued)

*Primary Examiner* — Vongsavanh Sengdara

(57) ABSTRACT

A light emitting device includes an LED having a (e.g., top) light output surface, a ceramic phosphor, and an adhesive layer positioned to attach the top of the LED to the ceramic phosphor. In one embodiment the adhesive layer is composed of multiple separate patches (regions) that define at least one channel therebetween, with the channel being open to an environment to permit oxygen permeation. The adhesive layer can be applied by a patternable dispensing system.

17 Claims, 3 Drawing Sheets

(56) References Cited

U.S. PATENT DOCUMENTS

| | | | |
|---|---|---|---|
| 2008/0290351 A1* | 11/2008 | Ajiki | H01L 27/15 257/E33.061 |
| 2009/0057698 A1* | 3/2009 | Okamura | H01L 33/502 257/98 |
| 2012/0012869 A1* | 1/2012 | Song | H01L 33/44 257/E33.061 |
| 2012/0074835 A1* | 3/2012 | Piquette | H01L 33/505 427/164 |
| 2014/0225149 A1 | 8/2014 | Sabathil et al. | |
| 2017/0368786 A1* | 12/2017 | Katami | B32B 27/40 |
| 2018/0053877 A1 | 2/2018 | Schricker et al. | |
| 2018/0159001 A1 | 6/2018 | Schricker et al. | |

FOREIGN PATENT DOCUMENTS

| | | |
|---|---|---|
| JP | 2004231948 A | 8/2004 |
| WO | 2007/003696 A1 | 1/2007 |
| WO | 2019/027952 A1 | 2/2019 |

OTHER PUBLICATIONS

International Search Report corresponding to PCT/US2019/053611 dated Feb. 20, 2020, 6 pages.
Written Opinion of the International Searching Authority corresponding to PCT/US2019/053611 dated Feb. 20, 2020, 7 pages.
European Search Report corresponding to EP application No. 1821355, dated Mar. 8, 2019, 1 page.
The extended European Search Report corresponding to EP18210355.6 dated Mar. 19, 2019, 10 pages.

* cited by examiner

FABRICATION FOR PRECISE LINE-BOND CONTROL AND GAS DIFFUSION BETWEEN LED COMPONENTS

CROSS REFERENCE TO RELATED APPLICATIONS

This application claims benefit of priority to U.S. Provisional Patent Application No. 62/738,631 filed Sep. 28, 2018, and to European Patent Application No. 18210355.6 filed Dec. 5, 2018, each of which is incorporated herein by reference in its entirety.

TECHNICAL FIELD

The present disclosure generally relates to attachment of a ceramic phosphor to semiconductor LED using a patterned adhesive.

BACKGROUND

Semiconductor light-emitting devices such as light emitting diodes and laser diodes (both referred to herein as LEDs) can be manufactured to include an LED die adhesively attached to a ceramic phosphor. Only a limited number of adhesives are generally suitable. To reduce light loss, the adhesive material should have a refractive index that closely matches that of the ceramic phosphor. The material selected should be as thin as possible (usually less than 5 microns), have a constant thickness, and be composed of materials resistant to browning or yellowing. It has been shown that oxygen plays a role in prevention or amelioration of browning or yellowing through its participation in photobleaching carbonaceous material. Further, since lack of environmental oxygen inhibits photobleaching, structures or compositions that allow for adequate oxygen permeability through the adhesive are necessary. While siloxane adhesives with some substituted phenyls (to increase the refractive index) are often used, they are still subject to browning due to low oxygen permeation.

In a currently used manufacturing process, a small volume of siloxane adhesive glue solution (about 3-10 micrograms) can be dispensed on top of a 1 mm x1 mm LED die. Typically, the glue is a liquid containing silicones and diluents, with a viscosity that allows droplets to partially spread on the surface of the die. Spreading of the liquid over the die depends on a combination of factors that include surface tension balance and viscosity of the glue (typically in the range of 0.3 to 1 Pa·s) which limits its spread. After glue dispense, a ceramic phosphor is brought into close proximity of the surface of the die by a "pick and place" tool. The tool applies a normal force for a short time, initiating a process in which the glue further spreads across the interface between the die and the ceramic phosphor. Normally, sufficient force is applied to a volume of glue sufficient to completely fill the gap. The final gap between the ceramic phosphor and the die is typically determined by a combination of factors, such as: glue surface tension, glue viscosity, force and time of the "pick and place" tool, volume of the droplet, position of the droplet relative to the center of the surface of the die, temperature of the die, and time elapsed between droplet dispense. Finally, the glue undergoes a curing process in which the glue layer may exhibit additional flow before reaching the gel point. The time elapsed between ceramic phosphor application and curing process and the temperature profile of the curing process (since viscosity and surface tension are affected by temperature) also influences the final spread, thickness and overflow of the glue. Unfortunately, this is a complex process, difficult to control, that results in large variability of the average thickness between devices as well as large variability within each device.

Attempts have been made to control thickness variability. For example, spacer particles have been added to the adhesive glue to ensure a minimum thickness. Unfortunately, only low viscosity glues can be used since viscosity must be low enough to allow for the glue to be squeezed until the particles make contact with both surfaces of the adherent components. Such low viscosity glues typically contain substantial amounts of solvents, which must be removed before curing. However, solvent removal leads to a shrink in resin dimensions, and the spacer particles can be compressed and form stress concentration centers that reduce device reliability. In addition, the presence of spacers often results in formation of voids that result from the opposite requirements of resin shrinkage by solvent removal and curing on one hand, while fixing the physical separation between the planes with the spacers on the other.

SUMMARY

In accordance with embodiments of the invention, a light emitting device can include a LED having a (e.g., top) light output surface and a ceramic phosphor attached by an adhesive layer to the light output surface of the LED. The adhesive layer can be composed of a high refractive index siloxane dispensed in multiple separate patches (regions) that define at least one channel therebetween, with the channel being open to an environment to permit oxygen permeation.

In selected embodiments, the adhesive layer is applied by a patternable dispensing system, which can include but is not limited to inkjet or aerosol jet printing systems. The adhesive layer can be applied to have a uniform thickness across each of the multiple separate patches. This uniform thickness can be less 5 microns, and in certain embodiments can have a uniform thickness of between 1 micron and 5 microns.

The channel(s) defined by the multiple separate patches can have a width between 10 microns and 50 microns and channel in some embodiments extend edge to edge across the adhesive layer. Alternatively, or in addition, the channel can be defined extend from an edge to near center across the adhesive layer. Multiple intersecting channels can be defined. Non-linear channels (e.g. curved) can be defined. Multiple channels with varying widths are also possible. In some embodiments, the channel can be filled with channel filling material that has a higher gas permeability than the adhesive layer.

In a method embodiment, a ceramic phosphor is attached to a light output surface of an LED. An adhesive layer is applied to the light output surface as multiple separate patches that define at least one channel therebetween, with the channel being open to an environment to permit oxygen permeation. The ceramic phosphor is then attached to the light output surface of the LED.

BRIEF DESCRIPTION OF THE DRAWINGS

Non-limiting and non-exhaustive embodiments of the present disclosure are described with reference to the following figures, wherein like reference numerals refer to like parts throughout the various figures unless otherwise specified.

DETAILED DESCRIPTION

Figure 1:
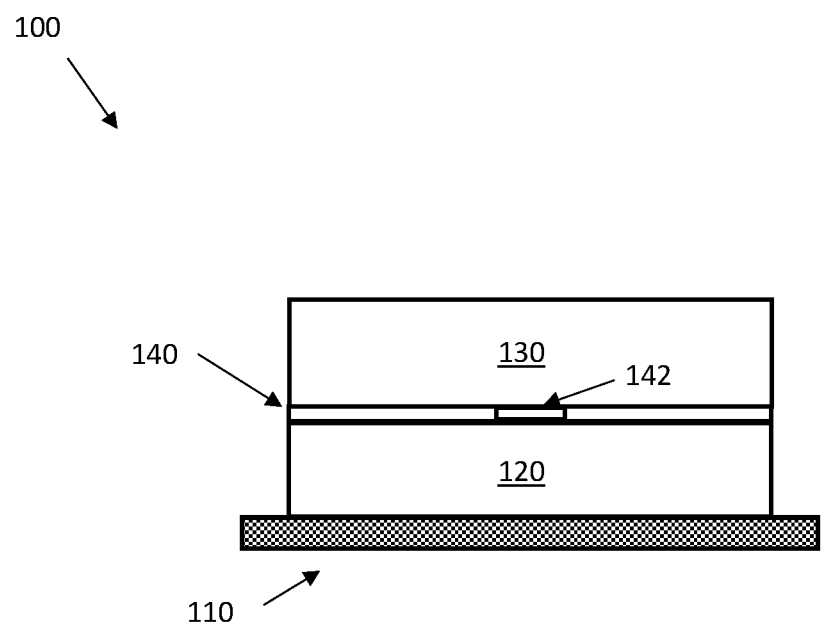
FIG. 1 illustrates in side cross-sectional view adhesive bonding of a phosphor ceramic to a LED.

FIG. 1 illustrates in side view a light emitting device 100 formed by adhesive bonding of a phosphor ceramic 130 to a LED 120 positioned on a substrate 110. Adhesive bonding is provided by an adhesive layer 140 that consist of one or more sections (regions) that define one or more channels 142 therein.

Figure 2:
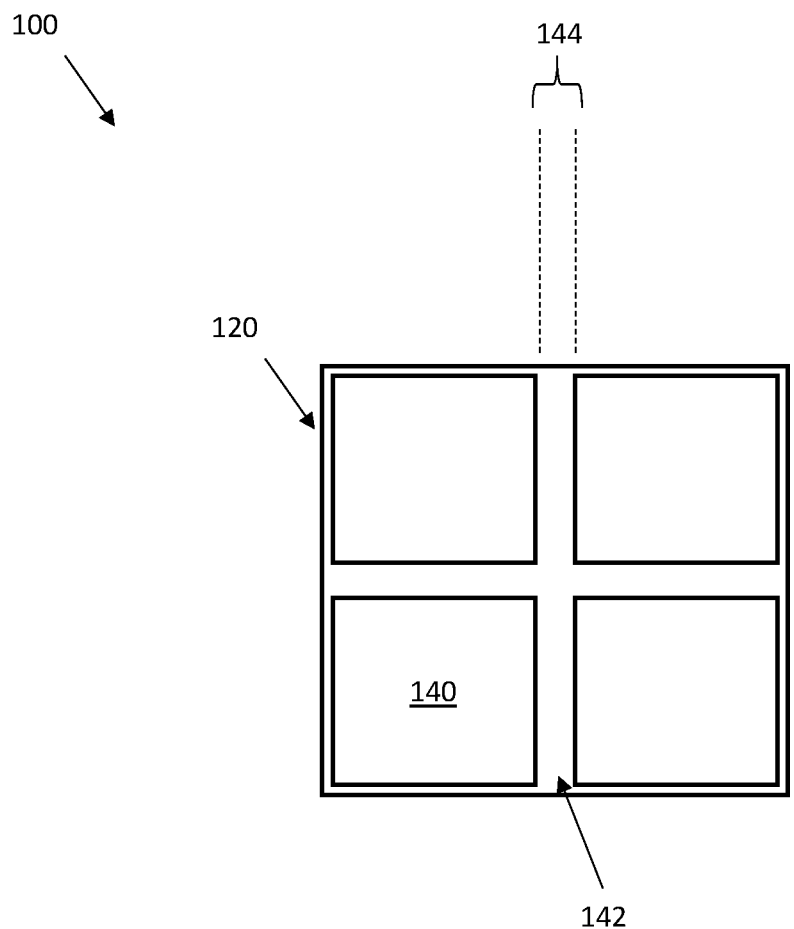
FIG. 2 illustrates in top view layout of adhesive glue on a LED.

FIG. 2 illustrates, in top view, layout of an adhesive layer such as described with respect to FIG. 1. As seen, four separate adhesive patches 140 are deposited on LED 120 to define multiple intersecting channels 142. The introduction of channels 142 between adhesive patches 140 leads to the formation of ducts or tubes when the ceramic phosphor 130 is attached to the LED 120. These channels can have a width 144 selected to be between 10 microns to 50 microns, wide enough to enable gas exchange, but sufficiently narrow to minimize optical losses caused by refractive index mismatch between substrates and ambient air.

Figure 3:
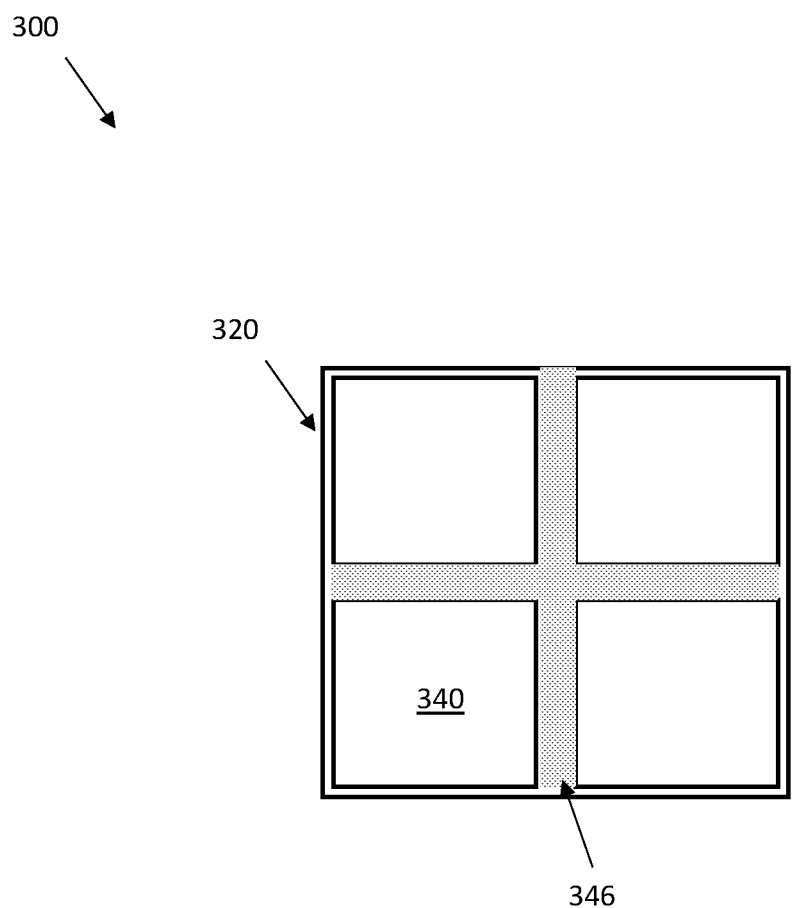
FIG. 3 illustrates in top view layout of adhesive glue and channel filling material on a LED.

FIG. 3 illustrates, in top view, layout of a light emitting device 300 with adhesive patches 340 dispensed atop LED 320 such as described with respect to FIGS. 1 and 2. In this embodiment the channels 346 are filled with another material. This material can be selected to have a higher gas-permeability than the first material.

The substrate 110 can be formed of sapphire or silicon carbide that is able to support an LED 120. The LED can include an epitaxially grown or deposited semiconductor n-layer. A semiconductor p-layer can then be sequentially grown or deposited on the n-layer, forming an active region at the junction between layers. Semiconductor materials capable of forming high-brightness light emitting diodes can include, but are not limited to, Group III-V semiconductors, particularly binary, ternary, and quaternary alloys of gallium, aluminum, indium, and nitrogen, also referred to as III-nitride materials.

Phosphor contained in glass, or as a pre-formed sintered ceramic phosphor, can include one or more wavelength converting materials able to create white light or monochromatic light of other colors. All or only a portion of the light emitted by the LED 120 may be converted by the wavelength converting material of the phosphor 130. Unconverted light may be part of the final spectrum of light, though it need not be. Examples of common devices include a blue-emitting LED segment combined with a yellow-emitting phosphor, a blue-emitting LED segment combined with green- and red-emitting phosphors, a UV-emitting LED segment combined with blue- and yellow-emitting phosphors, and a UV-emitting LED segment combined with blue-, green-, and red-emitting phosphors.

In one embodiment, attachment of the LED 120 to the ceramic phosphor 130 requires that an adhesive glue dries to become a low modulus viscoelastic solid or semisolid upon solvent removal. The adhesive glue should also exhibit a low roughness in order to achieve high tack. Consideration for viscoelastic properties, surface roughness and thickness can all be made to ensure that the adhesive maintains its shape after solvent removal and before the application of the adherent ceramic phosphor.

In another embodiment, the adhesive can be selected to become tacky at elevated temperatures (i.e. >40 C). The adhesive printed areas become a pressure sensitive adhesive (PSA) and/or temperature sensitive adhesive (TSA), heat pressure sensitive adhesive (HPSA) or Hot Melt Pressure sensitive adhesive (HMPSA).

Adhesive materials such as high refractive index (n>1.45) poly-siloxane materials can be used. These are currently utilized in LED manufacturing as binders in phosphor-converting films. Suitable materials are described for example in "Curable Compositions of Resin-Linear Organosiloxane Block Copolymers", disclosed by Dow Corning (see for example USPTO 2014/0357827, by Steven Swier) as well as materials discussed by Shin Etsu in U.S. Pat. Nos. 8,420,762, 7,858,198, and EP2589642-A1 by Shiobara, Kashawagi and co-workers.

Adhesive application can be provided by a patternable dispensing system such as inkjet printing (IJP) or aerosol jet printing (AJP). These systems allow for accurate X-Y addressable adhesive dispense of segmented areas (patches) of adhesives on either the LED or the ceramic phosphor. In some embodiments, Z-direction (i.e., thickness) dispense control is also available.

The channels can extend edge to edge across the adhesive layer or alternatively or in addition extend inward near to the center (i.e., near center being defined as a distance within one-quarter diameter of the LED with respect to the LED center. Multiple intersecting channels can be defined. Non-linear channels (e.g. curved) can be defined. Multiple channels with varying widths are also possible. Branching or fractal channels of the same width, or with stepwise or gradually narrowing widths can also be used.

A typical lateral dimension for an LED die is 250 microns to 2000 microns and the channels can be defined to have a width of 10 microns to about 50 microns in width. Advantageously, the channels act as ducts or paths that facilitate exchange of gases in and out of the adhesive layer.

Another embodiment allows for addressable dispense of multiple materials. For example, a second layer (e.g. resin or adhesive) with different physical or chemical characteristics may be added as a patterned channel fill, or alternatively, simply layered over the first layer. The second layer fills the channels generated by the printing of the first adhesive layer. The second material may have, for instance, higher gas-permeability than the first material. For example, polydim-ethyl-siloxane (PDMS) can be used. Advantageously, this channel filling second material provides improved optical coupling between the LED die and the ceramic phosphor, while at the same time facilitating transport of oxygen and other gases throughout the defined channel.

Having described the invention in detail, those skilled in the art will appreciate that, given the present disclosure, modifications may be made to the invention without departing from the spirit of the inventive concept described herein. Therefore, it is not intended that the scope of the invention be limited to the specific embodiments illustrated and described.

The invention claimed is:

1. A light emitting device comprising:
   a semiconductor light emitting diode (LED) comprising a light output surface;
   a phosphor comprising a first surface; and
   a high refractive index adhesive disposed between, in contact with, and attaching the light output surface of the LED and the first surface of the phosphor, the adhesive comprising a pressure sensitive adhesive, a temperature sensitive adhesive, a heat pressure sensitive adhesive, or a hot melt pressure sensitive adhesive, the adhesive arranged as two or more separate regions on the light output surface of the LED that define at least one channel therebetween, the channel located between the light output surface of the LED and the first surface of the phosphor and open to an environment external to the light emitting device, in operation, the channel allowing transport of gases through the channel.

2. The light emitting device of claim 1, wherein the adhesive has a uniform thickness across each of the multiple separate regions.

3. The light emitting device of claim 2, wherein the adhesive has a uniform thickness of less than 5 microns.

4. The light emitting device of claim 2, wherein the adhesive has a uniform thickness of between 1 micron and 5 microns.

5. The light emitting device of claim 1, wherein the channel has a width between 10 microns and 50 microns defined by the separate regions of the adhesive.

6. The light emitting device of claim 1, wherein the channel extends across the two or more separate regions of adhesive from an edge of the LED to an opposite edge of the LED.

7. The light emitting device of claim 1, wherein the channel extends through one of the two or more separate regions of adhesive from an edge of the LED to near center of the one region of adhesive.

8. The light emitting device of claim 1, wherein the separate regions of the adhesive define multiple intersecting channels.

9. The light emitting device of claim 1, wherein the separate regions of the adhesive define one or more non-linear channels.

10. The light emitting device of claim 1, wherein the separate regions of the adhesive define multiple channels with varying widths.

11. The light emitting device of claim 1, wherein the phosphor is a ceramic phosphor.

12. The light emitting device of claim 1, wherein the adhesive comprises a polysiloxane adhesive.

13. The light emitting device of claim 1, wherein the adhesive comprises a pressure sensitive adhesive.

14. The light emitting device of claim 1, wherein the adhesive comprises a temperature sensitive adhesive.

15. The light emitting device of claim 1, wherein the adhesive comprises a heat pressure sensitive adhesive.

16. The light emitting device of claim 1, wherein the adhesive comprises a hot melt pressure sensitive adhesive.

17. A light emitting device comprising:
a semiconductor light emitting diode (LED) comprising a light output surface;
a phosphor comprising a first surface; and
a high refractive index adhesive disposed between, in contact with, and attaching the light output surface of the LED and the first surface of the phosphor, the adhesive comprising a pressure sensitive adhesive, a temperature sensitive adhesive, a heat pressure sensitive adhesive, or a hot melt pressure sensitive adhesive, the adhesive arranged as two or more separate regions on the light output surface of the LED that define at least one channel therebetween, the channel located between the light output surface of the LED and the first surface of the phosphor and is filled with a material having a higher gas permeability than the adhesive,
in operation, the channel allowing transport of gases through the channel.

* * * * *